(12) United States Patent
Gossner

(10) Patent No.: US 6,713,841 B2
(45) Date of Patent: Mar. 30, 2004

(54) ESD GUARD STRUCTURE

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/066,877

(22) Filed: Feb. 4, 2002

(65) Prior Publication Data

US 2002/0096722 A1 Jul. 25, 2002

Related U.S. Application Data

(63) Continuation of application No. PCT/DE00/02599, filed on Aug. 3, 2000.

(30) Foreign Application Priority Data

Aug. 4, 1999 (DE) .......................... 199 36 636

(51) Int. Cl.⁷ ............................................... H01L 29/00
(52) U.S. Cl. ..................... 257/546; 257/173; 257/361; 257/362
(58) Field of Search ................................. 257/173–174, 257/355–363, 546

(56) References Cited

U.S. PATENT DOCUMENTS

| | | | |
|---|---|---|---|
| 4,115,709 A | | 9/1978 | Inoue et al. |
| 4,408,245 A | | 10/1983 | Pryor |
| 4,516,223 A | | 5/1985 | Erickson |
| 4,980,746 A | * | 12/1990 | Harrington, III ............. 257/551 |
| 5,159,518 A | | 10/1992 | Roy |
| 5,173,755 A | * | 12/1992 | Co et al. ..................... 257/361 |
| 5,343,053 A | * | 8/1994 | Avery ......................... 257/173 |
| 5,473,169 A | * | 12/1995 | Ker et al. .................... 257/173 |
| 5,751,041 A | | 5/1998 | Suzuki et al. |
| 5,814,865 A | * | 9/1998 | Duvvury et al. ............. 257/360 |
| 5,872,379 A | | 2/1999 | Lee |
| 5,895,940 A | * | 4/1999 | Kim ........................... 257/173 |
| 5,898,205 A | * | 4/1999 | Lee ............................. 257/355 |
| 6,246,079 B1 | * | 6/2001 | Chen ......................... 257/173 |
| 6,329,694 B1 | * | 12/2001 | Lee et al. .................... 257/372 |
| 6,448,123 B1 | * | 9/2002 | Lee et al. .................... 438/200 |

* cited by examiner

Primary Examiner—Amir Zarabian
Assistant Examiner—Ida M. Soward
(74) Attorney, Agent, or Firm—Laurence A. Greenberg; Werner H. Stemer; Ralph E. Locher

(57) ABSTRACT

An ESD guard structure includes a self-aligned lateral p+/n+ diode serving as the trigger diode. This lateral trigger diode is largely independent of alignment precisions. The n+ and p+ regions are implanted on opposite sides of a gate electrode. The edges of the resist masks of the respective process diffusions are placed onto this gate electrode such that they always rest on the gate electrode, within the limits of the alignment capabilities. This way, the spacing between the n+ region and the p+ region is defined solely by the length or width of the gate electrode, which can be closely controlled. This technique is limited only by the requirement that the minimum gate electrode length must be no less than twice the maximum alignment precision.

18 Claims, 2 Drawing Sheets

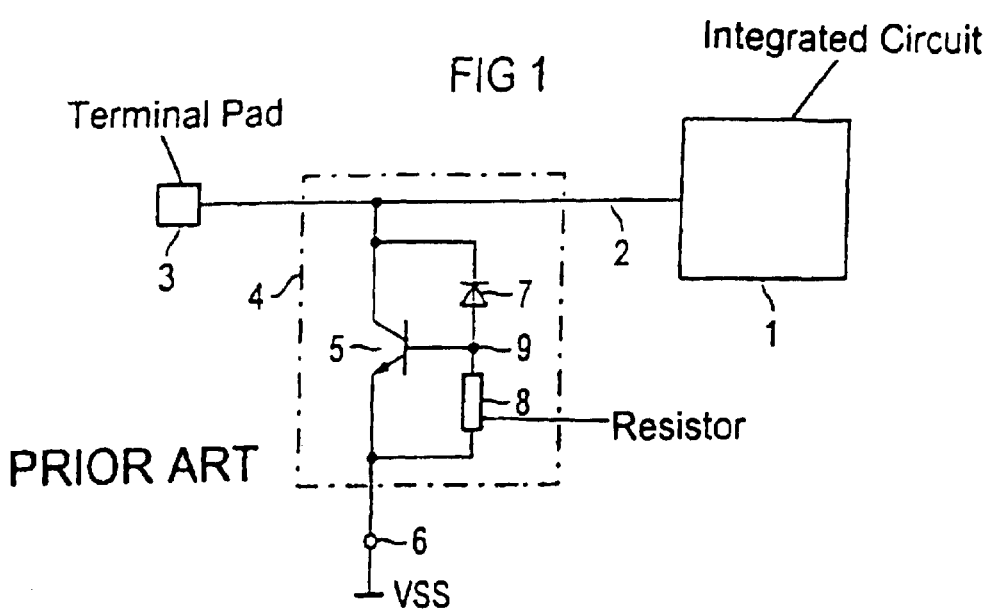
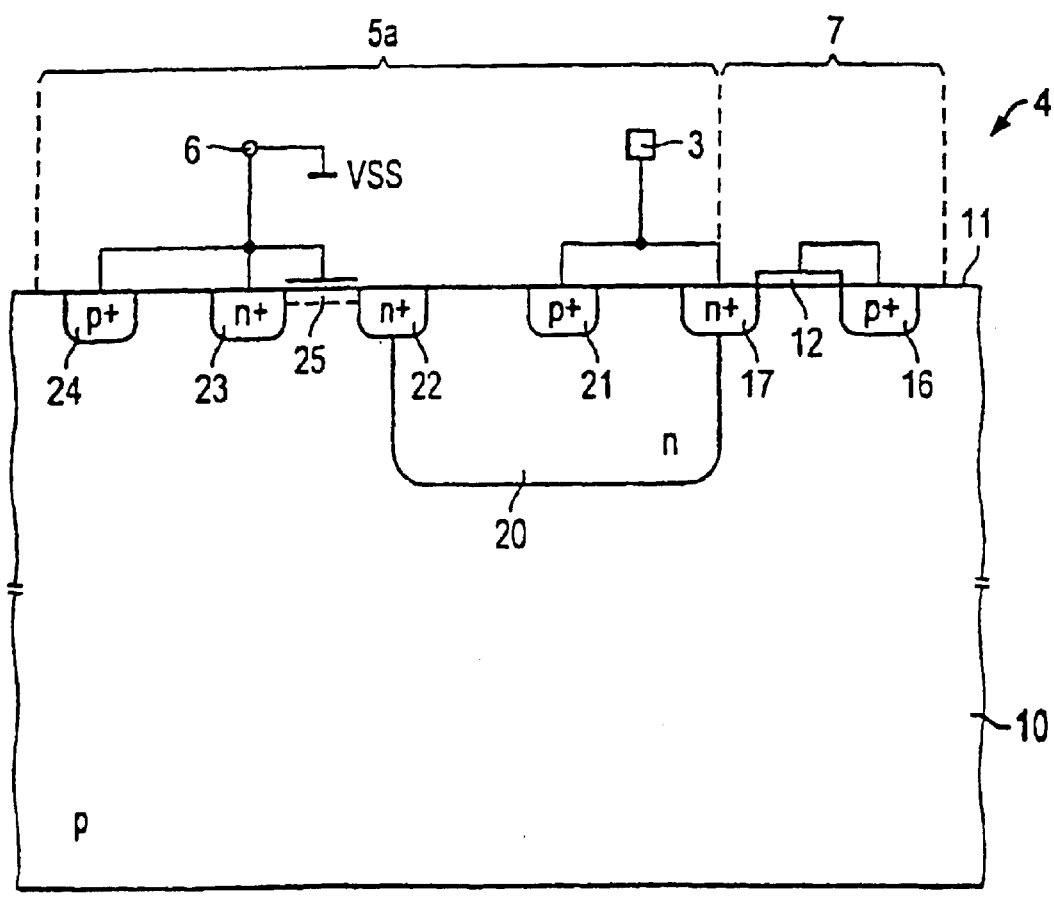

ESD GUARD STRUCTURE

CROSS-REFERENCE TO RELATED APPLICATION

This application is a continuation of copending International Application No. PCT/DE00/02599, filed Aug. 3, 2000, which designated the United States.

BACKGROUND OF THE INVENTION

Field of the Invention

The invention relates to an ESD structure for an integrated circuit.

An ESD guard structure is described in Design and Layout of a High ESD Performance NPN Structure for Submicron BiCMOS/Bipolar Circuits (J. Chen et al., Proceedings of the IEEE IRPS (1996), p. 227 ff).

Circuits that are integrated in a chip contain guard structures for protecting the inputs or outputs (I/O ports) against electrostatic overvoltages and consequent electrostatic discharges (ESD). These ESD guard structures are disposed between the input pad of the integrated circuit and the input or output terminals requiring protection. Given interference by a parasitic overvoltage, the ESP guard structure switches through to divert the parasitic overvoltage impulse. In extreme cases, such overvoltage impulses can lead to the destruction of the integrated circuit.

But with the constantly greater miniaturization in semiconductor technology, it is becoming more and more difficult to provide ESD guard structures that detect this kind of parasitic overvoltage impulse. Particularly in contemporary and future CMOS technologies, because of the small window width between the operating voltage and the breakdown voltage of the elements of the integrated circuits, it is very important that the corresponding ESD guard structures switch on precisely and reproducibly within an extremely narrowly defined voltage range.

FIG. 1 shows an ESD guard structure of the species where the guard element is triggered by a series circuit including a breakdown diode and a resistor (Also see Chen et al.). FIG. 1 shows an integrated circuit 1 that is connected to a terminal pad 3 via a connecting line 2. An ESD guard structure 4 is disposed between the terminal pad 3 and the integrated circuit 1. The ESD guard structure 4 in FIG. 1 consists of a protective transistor 5 having a load path connected between the line 2 and the terminal 6 that is charged with a reference potential VSS. A series circuit including a trigger diode 7 and a resistor 8 is connected in parallel to the load path of the protective transistor 5. The center tap 9 of this series circuit is connected to the control terminal of the protective transistor 5. If the voltage at the terminal pad 3 exceeds the breakdown voltage of the trigger diode 7, the control terminal of the protective transistor 6 is actuated via the potential at the center tap 9 such that the protective transistor 5 and the guard structure 4 are switched on.

But the production of such a trigger diode having an optimally definable and reproducible breakdown voltage is problematic. Furthermore, the value of the breakdown voltage must not fluctuate too greatly in different ESD guard structures.

The trigger diode is also required to have an optimally small leakage current in the off state.

Therefore, an n+/p+ Zener diode is frequently utilized as the trigger diode. Very low breakdown voltages can be achieved with such trigger diodes, however, a very large leakage current is disadvantageously generated. On the other hand, trigger diodes with weakly doped p+ regions and/or n+ regions, and thus with smaller leakage currents, exhibit extremely high breakdown voltage values.

Another problem is that the breakdown voltage values of the trigger diodes are usually adjustable only by adjusting the dopant concentrations, which sometimes interferes greatly in the functionality of the remaining circuit elements (i.e. protective transistor, resistor) of the ESD guard structure.

Thus, lateral trigger diodes are frequently employed, which are created by aligning a p+ region relative to the corresponding n+ region. The p+ region and the n+ region are arranged at a small distance away from each other. In lateral trigger diodes such as this, the breakdown voltage can be easily adjusted exclusively by layout measures. Nevertheless, because of the limited alignment precision of these layout measures, undesirable (that is to say, unacceptable) fluctuations of the breakdown voltage usually occur.

SUMMARY OF THE INVENTION

It is accordingly an object of the invention to provide an electro-static discharge guard structure having a trigger diode, and a method of producing the trigger diode which overcomes the above-mentioned disadvantages of the prior art apparatus and methods of this general type.

In particular, it is an object of the invention to provide an ESD guard structure of the above-described type whose trigger diode has an optimally low breakdown voltage and a small leakage current. Furthermore, the breakdown voltage of this trigger diode will be adjustable with optimal precision and is not subject to large fluctuations.

With the foregoing and other objects in view there is provided, in accordance with the invention, an electro-static discharge guard structure for protecting an integrated circuit. The guard structure includes: a terminal pad and an electrically conductive connection connecting the terminal pad to the integrated circuit; a terminal connected to a reference potential; a guard element having a load path connected between the terminal pad and the terminal; and a lateral trigger diode having a breakdown voltage. The trigger diode is for switching the guard element through when the breakdown voltage is exceeded. The trigger diode is configured between the control terminal of the guard element and the terminal pad. The guard structure also includes a gate electrode having a length and a width. The trigger diode includes an anode zone and a cathode zone. The anode zone and the cathode zone are aligned with respect to the gate electrode. The anode zone and the cathode zone are spaced apart a distance corresponding to a dimension selected from the group consisting of the width of the gate electrode and the length of the gate electrode.

In accordance with an added feature of the invention, the guard element is a thyristor or a transistor.

In accordance with an additional feature of the invention, the trigger diode is a Zener diode with a low breakdown voltage.

In accordance with another feature of the invention, the trigger diode is a PIN switching diode with a low breakdown voltage.

In accordance with a further feature of the invention, the width or the length of the gate electrode is at least twice as large as the maximum alignment precision.

In accordance with a further added feature of the invention, there is provided, a switching device for adjusting the breakdown voltage of the trigger diode. The switching device is connected to the gate electrode.

In accordance with a further additional feature of the invention, the gate electrode at least partially consists of polysilicon.

In accordance with yet an added feature of the invention, the anode zone has a very high dopant concentration; and the cathode zone has a very high dopant concentration.

With the foregoing and other objects in view there is also provided, in accordance with the invention, method for producing the trigger diode in the ESD guard structure, which includes steps of: providing a semiconductor having a surface and having the gate electrode disposed on the surface; forming a first mask on a region of the surface such that the first mask has a mask edge that is configured directly over the gate electrode; incorporating dopant of a first conductivity type into unmasked regions of the surface, and then dissolving the first mask; forming a second mask on other regions of the surface such that the second mask has a mask edge that is configured over the gate electrode; and incorporating dopant of a second conductivity type into unmasked regions of the semiconductor body, and then dissolving the second mask.

In accordance with an added mode of the invention, ion implantation is used to perform the step of incorporating the dopant of the first conductivity type; and ion implantation is used to perform the step of incorporating the dopant of the second conductivity type.

In accordance with an additional mode of the invention, a lithography process is used form the first mask; the first mask is formed to at least partially contain a photosensitive resist; a lithography process is used form the second mask; the second mask is formed to at least partially contain a photosensitive resist.

The inventive ESD guard structure includes a self-aligned lateral p+/n+ diode serving as the trigger diode. This lateral trigger diode is largely independent of alignment precisions. The n+ and p+ regions are implanted on opposite sides of a gate electrode. The edges of the resist masks of the respective process diffusions are placed onto this gate electrode such that they always rest on the gate electrode, within the limits of the alignment capabilities. This way, the spacing between the n+ region and the p+ region is defined solely by the length or width of the gate electrode, which can be closely controlled. This technique is limited only by the requirement that the minimum gate electrode length must be no less than twice the maximum alignment precision, in order to satisfy the above conditions.

With the inventive ESD structure and the inventive layout method for producing the trigger diode of this ESD guard structure, the value of the breakdown voltage can be precisely defined and reproduced.

The unique advantage of the invention is that the gate electrode is utilized to a certain extent as a "spacer" between the p+ region and the n+ region of the trigger diode. The trigger diode so produced then serves as a trigger element for the ESD guard structure.

A switching transistor, which may be a bipolar or CMOS transistor, is typically utilized as the switching element for the ESD guard structure. Of course, it is also imaginable for the guard element to be constructed as a thyristor.

The breakdown voltage of the trigger diode can also be influenced by suitably configuring the gate electrode wiring.

Other features which are considered as characteristic for the invention are set forth in the appended claims.

Although the invention is illustrated and described herein as embodied in a esd guard structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a prior art ESD guard structure for an integrated circuit;

FIG. 3 shows an ESD guard structure that is constructed as a thyristor with a self-aligned trigger diode.

DESCRIPTION OF THE PREFERRED EMBODIMENTS

Figure 2A:
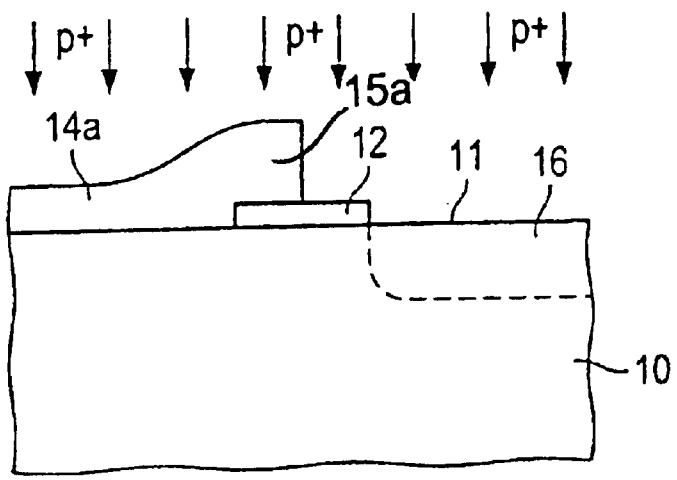
FIGS. 2A–2C show a semiconductor body during various steps used for producing a self-aligned trigger diode of an inventive ESD structure.

Identical, i.e. functionally identical, elements have been provided with identical reference characters in all of the figures. Referring now to the figures of the drawing in detail and first, particularly, to FIGS. 2A–2C thereof, there is schematically shown an inventive method for producing a self-aligned trigger diode for an inventive ESD guard structure.

Figure 2B:
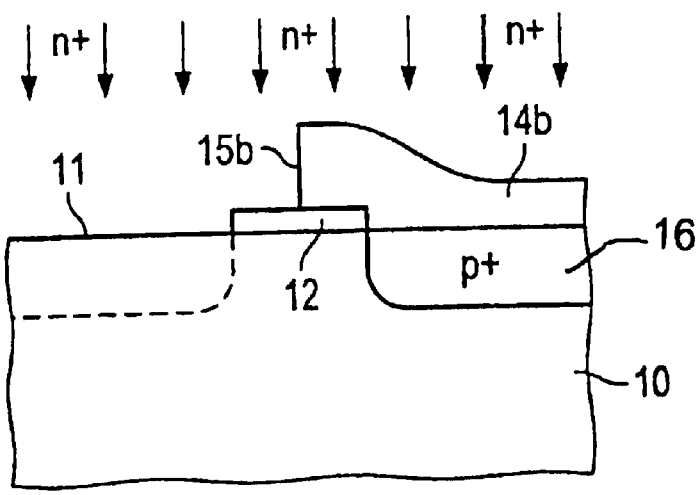
Figure 2C:
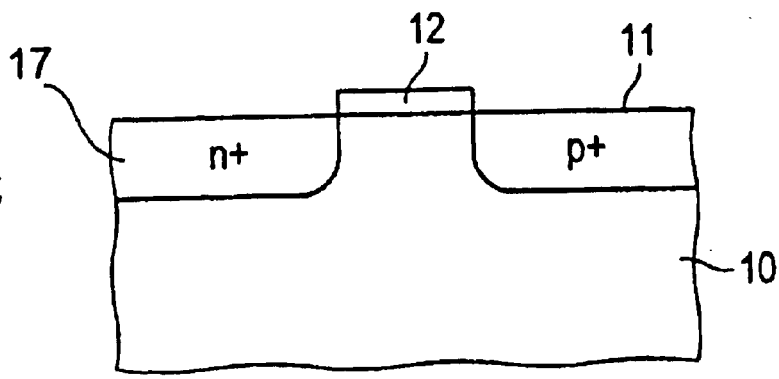

A portion of a semiconductor body 10 is shown in FIGS. 2A–2C. The semiconductor body 10 in the present exemplary embodiment consists of a doped silicon substrate. A gate electrode 12 is disposed on the surface 11.

The gate electrode 12 is typically rectangular, i.e. fashioned as a printed conductor. Of course, it would also be possible for the gate electrode 12 to have a circular or hexagonal shape, etc. The gate electrode 12 is typically constructed as a polysilicon gate electrode. It is also possible for the gate electrode 12 to be constructed from a metal or a metal silicide.

In FIG. 2A a part of the surface 11 is covered with a photoresist mask 14a. The photoresist mask 14a covers the left portion of the surface 11 of the semiconductor body 10 as well as a portion of the gate electrode 12. The edge 15a of the photoresist mask 14a is placed on the gate electrode 12 to precisely cover all parts of the surface 11 to the left of the gate electrode 12 and no parts to the right of the gate electrode 12. This can be accomplished without significant difficulties, because the size of the gate electrode 12 is such that the edge 15a will always rest on the gate electrode 12.

After structuring the photoresist mask 14a and aligning the edge 15a directly over the gate electrode 12, the semiconductor body 10 is implanted with p-doped ions. With this p-implantation, a p+ doped anode zone 16—a strongly doped zone in the present example—can be created below the surface regions 11 that are not covered by the photoresist mask 14a and the gate electrode 12. After the anode zone 16 is implanted, the photoresist mask 14a can be dissolved from the surface 11 of the semiconductor body 10.

Next, in a further lithography process, the semiconductor body 10 is structured such that the photoresist mask 14b is applied on the surface regions 11 to the right of the gate electrode 12 (see FIG. 2B). In the manner described above in connection with FIG. 2A, the second mask 14b is applied and the edge 15b of the second mask 14b is aligned directly over the gate electrode 12. Next, a second implantation process is utilized to implant n-doped ions in the semiconductor body 10. In this second implantation process, an n+ doped cathode zone 17 is created in the surface regions 11 that are not covered by the second photoresist mask 14b and the gate electrode 12. Next, the second photoresist mask 14b is dissolved from the surface 11 of the semiconductor body 10 in a suitable etching process.

The dopant concentration of the zones 16, 17 can be purposefully set by the implantation proportion; and the depth of the zones 16, 17 can be set by the implantation energy.

In the region of the gate electrode 12 and the photoresist masks 14a, 14b, the doped atoms do not reach the semiconductor body, but rather remain in the corresponding photosensitive resist of the masks 14a, 14b, or in the polysilicon of the gate electrode 12, respectively. Care must simply be taken that the thickness of the gate electrode 12 and the photoresist mask 14a, 14b are selected sufficiently large.

This way, a trigger diode emerges (see FIG. 2c) that contains a strongly n-doped cathode zone 17 and a strongly p-doped anode zone 16. These two zones 16, 17 have been created as self-aligned zones with respect to the edges of the gate electrode 12. The two zones 16, 17 are thus spaced apart from one another in which the distance between them substantially corresponds to the corresponding length of the gate electrode 12. The gate electrode 12 to a certain extent corresponds to a "spacer" between the anode zone 16 and the cathode zone 17. The produced trigger diode can then be utilized as the trigger element for an ESD guard structure. The precisely definable spacing guarantees that the trigger diode, and thus, the ESD guard structure, have a precisely adjustable breakdown voltage.

FIG. 3 is a schematic representation of a subsection of the realization of an inventive ESD guard structure consisting of a thyristor 5a that is actuated by a trigger diode 7.

An n-doped trough 20 is arranged in the p-doped substrate of the semiconductor body 10. A first p+ doped zone 21 is embedded in the trough at the surface 11 of the semiconductor body 10. In addition, an n+ doped cathode zone 17 and a first n+ doped zone 22 are embedded into the surface 11 of the semiconductor body 10 such that they are connected to the trough 21 as well as to the p-substrate of the semiconductor body 10. In addition, a second n+ doped zone 23 and a second p+ doped zone 24 are embedded in the semiconductor body 10.

A channel zone 25, which is controllable via a channel control electrode, is provided between the zones 22, 23.

The zones 23, 24 are respectively connected to terminal 6, and thus, to reference potential VSS. The zones 17, 21 are respectively connected to the terminal pad 3. The zones 17, 20, 21, 22, 23, 24 form the thyristor 5a of the ESD guard structure. The anode zone 16, which is connected to the gate electrode, and the cathode zone 17 form the trigger diode that actuates the thyristor.

The operation of the inventive ESD guard structure shown in FIG. 3 will now be described in detail.

If a noise signal is coupled in via the terminal pad 3, and this signal exceeds the breakdown voltage of the trigger diode 7, then this trigger diode 7 actuates the control transistor of the thyristor 5a such that the space charge zone at the pn junction of the actuating transistor in the diode circuit is contiguous, and the actuating transistor switches through. The base terminal of the switching transistor of the thyristor 5a is thereby actuated, so that given a sufficiently high actuating current, this is also controlled to be in a conductive state. This produces a current path from the terminal pad 3 to the zone 23, and thus to the terminal 6, via the cathode zone 17, the trough 21, the zone 22, and the channel 25. The noise signal is diverted to the terminal 6, and consequently to reference potential VSS, and does not enter the integrated circuit 1.

The inventive ESD guard structure is particularly well suited to a complex integrated circuit such as a microcontroller, a semiconductor memory or a logic element. The integrated circuit and the appertaining ESD structure are preferably realized as bipolar elements, i.e. produced in smart power technology. But it is also advantageous when the integrated circuit and ESD guard structure are produced in CMOS technology.

I claim:

1. In combination with an integrated circuit, an electrostatic discharge guard structure for protecting the integrated circuit, the guard structure comprising:

a terminal pad and an electrically conductive connection connecting said terminal pad to the integrated circuit;

a terminal connected to a reference potential;

a guard element having a load path connected between said terminal pad and said terminal, said guard element having a control terminal; and a lateral Positive-Isolating-Negative (PIN) trigger diode having a low breakdown voltage, said trigger diode for switching said guard element through when the breakdown voltage is exceeded, said trigger diode configured between said control terminal of said guard element and said terminal pad;

a gate electrode having a length and a width;

said trigger diode including an anode zone and a cathode zone, said anode zone containing a dopant of a first conductivity type, and said cathode zone containing a dopant of a second conductivity type;

said anode zone and said cathode zone being aligned with respect to said gate electrode; and said anode zone and said cathode zone being spaced apart a distance corresponding to a dimension selected from the group consisting of said width of said gate electrode and said length of said gate electrode.

2. The electrostatic guard structure according to claim 1, wherein said guard element is selected from the group consisting of a thyristor and a transistor.

3. The electrostatic guard structure according to claim 2, wherein said trigger diode is a Zener diode.

4. The electrostatic guard structure according to claim 1, wherein said trigger diode is a Zener diode.

5. The electrostatic guard structure according to claim 1, wherein the dimension is at least twice as large as a maximum alignment precision.

6. The electrostatic guard structure according to claim 1, comprising:

a switching device for adjusting the breakdown voltage of said trigger diode;

said switching device connected to said gate electrode.

7. The electrostatic guard structure according to claim 1, wherein said gate electrode at least partially consists of polysilicon.

8. The electrostatic guard structure according to claim 1, wherein:

said anode zone has a very high dopant concentration; and said cathode zone has a very high dopant concentration.

9. In combination with an integrated circuit, an electrostatic discharge guard structure for protecting the integrated circuit, the guard structure comprising:

a terminal pad and an electrically conductive connection connecting said terminal pad to the integrated circuit;

a terminal connected to a reference potential;

a guard element having a load path. connected between said terminal pad and said terminal, said guard element having a control terminal; and a lateral trigger diode having a breakdown voltage, said trigger diode for switching said guard element through upon the breakdown voltage being exceeded, said trigger diode configured between said control terminal of said guard element and said terminal pad;

a gate electrode having a length and a width;

said trigger diode including an anode zone and a cathode zone, said anode zone containing a dopant of a first conductivity type, and said cathode zone containing a dopant of a second conductivity type;

said anode zone and said cathode zone being aligned with respect to said gate electrode; and said anode zone and said cathode zone being spaced apart a distance corresponding to a dimension selected from the group consisting of said width of said gate electrode and said length of said gate electrode, said dimension being at least twice as large as a maximum alignment precision.

10. The electrostatic guard structure according to claim 9, wherein said guard element is selected from the group consisting of a thyristor and a transistor.

11. The electrostatic guard structure according to claim 9, wherein said trigger diode is a PIN switching diode with a low breakdown voltage.

12. The electrostatic guard structure according to claim 9, wherein said trigger diode is a Zener diode with a low breakdown voltage.

13. The electrostatic guard structure according to claim 9, further comprising:

a switching device for adjusting the breakdown voltage of said trigger diode;

said switching device connected to said gate electrode.

14. In combination with an integrated circuit, an electrostatic discharge guard structure for protecting the integrated circuit, the guard structure comprising:

a terminal pad and an electrically conductive connection connecting said terminal pad to the integrated circuit;

a terminal connected to a reference potential;

a guard element having a load path connected between said terminal pad and said terminal, said guard element having a control terminal; and a lateral trigger diode having a breakdown voltage, said trigger diode for switching said guard element through upon the breakdown voltage being exceeded, said trigger diode configured between said control terminal of said guard element and said terminal pad;

a gate electrode having a length and a width;

said trigger diode including an anode zone and a cathode zone, said anode zone containing a dopant of a first conductivity type, and said cathode zone containing a dopant of a second conductivity type;

said anode zone and said cathode zone being aligned with respect to said gate electrode;

said anode zone and said cathode zone being spaced apart a distance corresponding to a dimension selected from the group consisting of said width of said gate electrode and said length of said gate electrode; and a switching device for adjusting the breakdown voltage of said trigger diode, said switching device being connected to said gate electrode.

15. The electrostatic guard structure according to claim 14, wherein said guard element is selected from the group consisting of a thyristor and a transistor.

16. The electrostatic guard structure according to claim 14, wherein said trigger diode is a PIN switching diode with a low breakdown voltage.

17. The electrostatic guard structure according to claim 14, wherein said trigger diode is a Zener diode with a low breakdown voltage.

18. The electrostatic guard structure according to claim 14, wherein the dimension is at least twice as large as a maximum alignment precision.

\* \* \* \* \*